（12）United States Patent
Matsushita et al.

(10) Patent No.: US 8,709,278 B2
(45) Date of Patent: Apr. 29, 2014

(54) POLISHING COMPOSITION

(75) Inventors: Takayuki Matsushita, Kyoto (JP);
Noriaki Sugita, Kyoto (JP)

(73) Assignee: Nitta Haas Incorporated, Osaka (JP)

( * ) Notice: Subject to any disclaimer, the term of this patent is extended or adjusted under 35 U.S.C. 154(b) by 516 days.

(21) Appl. No.: 13/003,366

(22) PCT Filed: Jul. 13, 2009

(86) PCT No.: PCT/JP2009/062696
§ 371 (c)(1),
(2), (4) Date: Jan. 10, 2011

(87) PCT Pub. No.: WO2010/005103
PCT Pub. Date: Jan. 14, 2010

(65) Prior Publication Data
US 2011/0121224 A1    May 26, 2011

(30) Foreign Application Priority Data

Jul. 11, 2008 (JP) .................... 2008-182078

(51) Int. Cl.
*C09K 13/06* (2006.01)
(52) U.S. Cl.
USPC ......... 252/79.4; 252/79.1; 252/79.5; 438/692
(58) Field of Classification Search
USPC ............... 252/79.1–79.4, 79.5; 438/691–693; 216/89, 90
See application file for complete search history.

(56) References Cited

U.S. PATENT DOCUMENTS

| | | | |
|---|---|---|---|
| 7,204,865 | B2 | 4/2007 | Yamada |
| 7,485,612 | B2 | 2/2009 | Takashima |
| 7,524,347 | B2 | 4/2009 | Sun et al. |
| 2001/0003672 | A1 | 6/2001 | Inoue et al. |
| 2004/0142835 | A1 | 7/2004 | Takashima |
| 2005/0054203 | A1* | 3/2005 | Yamada ...................... 438/695 |
| 2006/0008925 | A1 | 1/2006 | Takashima |
| 2006/0096496 | A1 | 5/2006 | Sun et al. |
| 2010/0294983 | A1* | 11/2010 | Matsushita et al. .......... 252/79.1 |

FOREIGN PATENT DOCUMENTS

| | | |
|---|---|---|
| CN | 101044600 A | 9/2007 |
| EP | 0967260 A1 | 12/1999 |
| EP | 1512732 A1 | 3/2005 |
| EP | 1829093 A2 | 9/2007 |
| EP | 2236574 A1 | 10/2010 |
| JP | 2001003036 A | 1/2001 |
| JP | 2002114970 A * | 4/2002 ............... C09K 3/14 |
| JP | 2004140394 A | 5/2004 |
| JP | 2005085858 A | 3/2005 |
| JP | 2005101479 A | 4/2005 |
| JP | 2006016438 A | 1/2006 |
| JP | 2008517791 A | 5/2008 |
| WO | 2006049912 A2 | 5/2006 |

OTHER PUBLICATIONS

ISR for PCT/JP2009/062696 dated Oct. 6, 2009.
Written Opinion for Singapore Patent Application No. 201100168-2 mailed Feb. 16, 2012.
CN Office Action, dated Aug. 8, 2012, issued in CN Application No. 200980127160.X.
English translation of the international preliminary report on patentability (Chapter 1), for application No. PCT/JP2009/062696, mailed Feb. 17, 2011.
Office Action corresponding to CN200980127160.X, dated Mar. 22, 2013.
Office Action mailed Sep. 3, 2013, corresponds to Japanese patent application No. 2010-519838.

* cited by examiner

*Primary Examiner* — Lan Vinh
(74) *Attorney, Agent, or Firm* — Lowe Hauptman & Ham, LLP

(57) ABSTRACT

A polishing composition that allows polishing speed to be increased and surface roughness to be reduced is provided. The polishing composition according to the present invention includes a compound including at least an oxyethylene group or an oxypropylene group in a block polyether represented by the following general formula (1), a basic compound, and abrasives: >N—R—N< (1) where R represents an alkylene group expressed as $C_nH_{2n}$ and "n" is an integer not less than 1.

6 Claims, No Drawings

POLISHING COMPOSITION

RELATED APPLICATIONS

The present application is National Phase of PCT/JP2009/062696 filed Jul. 13, 2009, and claims priority from, Japanese Application Number 2008-182078 filed Jul. 11, 2008.

TECHNICAL FIELD

The present invention relates to a polishing composition for use in the process of polishing a silicon wafer.

BACKGROUND ART

Silicon wafer polishing by CMP allows highly precise planarizing to be achieved by multiple steps of, i.e., three or four steps of polishing. The primary polishing and the secondary polishing conducted in the first and second steps are mainly intended for surface planarizing and require high polishing speeds.

In order to achieve a high polishing speed, the shape or size of abrasives or the amount of addition is varied or a basic compound is added. A polishing agent disclosed by Patent Document 1 allows the polishing speed to be improved by optimizing the shape of colloidal silica and its specific surface area.

Not only the high polishing speed is required but also the surface roughness of a polished wafer must be reduced, and the surface roughness is improved by adding a surfactant or an organic compound. A polishing composition disclosed by Patent Document 2 includes a polishing agent and, as an additive, at least one compound selected from the group consisting of a hydroxide of an alkali metal, a carbonate of an alkali metal, a hydrogencarbonate of an alkali metal, a quaternary ammonium salt, a peroxide, and a peroxy acid compound, so that a planarized polished surface can be formed and a higher polishing speed can be obtained.

As the multi-step polishing has come to be carried out as general process in order to provide a wafer planarized with high precision, the difference between finishing polishing in the final steps such as the third and fourth steps and the secondary polishing has diminished, and polishing characteristics similar to the finishing polishing have been requested also in the secondary polishing.

As the performance of evaluation equipment improves, evaluation items used for the finishing polishing can be applied in evaluation in the secondary polishing, and for example the same items as those in the finishing polishing such as reduction in LPD (light point defects) and improvement in defoaming properties are requested in the secondary polishing.

A polishing composition disclosed by Patent Document 3 includes at least one selected from a block polyether including an oxyethylene group and an oxypropylene group, silicon dioxide, a basic compound, hydroxyethyl cellulose and a polyvinyl alcohol and water, so that COP (Crystal Originated Particle) and haze levels are improved.

PRIOR ART DOCUMENTS

Patent Documents

Patent Document 1: JP 2004-140394 A
Patent Document 2: JP 2001-3036 A
Patent Document 3: JP 2005-85858 A

SUMMARY OF THE INVENTION

Problems to be Solved by the Invention

The polishing compositions disclosed by Patent Documents 1 and 2 allow the polishing speed and the surface roughness of a wafer after polishing to be improved to some extent but not to a sufficient level. The polishing composition disclosed by Patent Document 3 does not have defoaming properties and foam generated during dilution or stirring while using the polishing composition sticks to a tank wall surface for supplying the polishing composition or to various parts of polishing equipment, and aggregates attributable to the foam are generated, which degrades LPD, so that sufficient polishing performance cannot be obtained in the secondary polishing.

An object of the present invention is to provide a polishing composition that allows the polishing speed to be increased and the surface roughness to be reduced.

Means for Solving the Problems

A polishing composition according to the present invention includes a compound including an alkylamine structure having two nitrogen atoms represented by the following general formula (1) and at least one block polyether (that includes an oxyethylene group and an oxypropylene group) bonded to the two nitrogen atoms in the alkylamine structure, a basic compound, and abrasives.

$$>N-R-N< \quad (1)$$

where R represents an alkylene group expressed as $C_nH_{2n}$ and n is an integer not less than 1.

According to the present invention, said block polyether includes at least one selected from ether groups represented by the following general formulas (2) to (5):

$$-[(EO)a\text{-}(PO)b]x\text{-}H \quad (2)$$

$$-[(PO)b\text{-}(EO)a]x\text{-}H \quad (3)$$

$$-(EO)a\text{-}[(PO)b\text{-}(EO)a]x\text{-}H \quad (4)$$

$$(PO)b\text{-}[(EO)a\text{-}(PO)b]x\text{-}H \quad (5)$$

where EO represents an oxyethylene group, PO represents an oxypropylene group, and "a", "b" and "x" each represent an integer not less than 1.

According to the present invention, the number "a" of the oxyethylene groups in said ether group is not less than 1 and not more than 500 and the number "b" of the oxypropylene groups is not less than 1 and not more than 200.

According to the present invention, when said block polyether includes at least one selected from the ether groups represented by said general formulas (2) to (5), the mass ratio EO:PO between the oxyethylene groups and the oxypropylene groups in said ether group is not less than 10:90 and not more than 80:20.

According to the present invention, said basic compound is at least one selected from a hydroxide or a carbonate of an alkali metal or alkali earth metal element, a quaternary ammonium and a salt thereof, a primary amine, a secondary amine, and a tertiary amine.

According to the present invention, said abrasives are at least one selected from silicon dioxide, alumina, ceria, and zirconia.

The present invention further includes a water-soluble polymer compound.

Effects of the Invention

According to the present invention, the polishing composition includes a compound including an oxyethylene group and an oxypropylene group in a block polyether expressed by said general formula (1), a basic compound, and abrasives.

The inclusion of these substances allows the polishing speed to be increased and the surface roughness to be reduced.

According to the present invention, said block polyether can be at least one selected from ether groups represented by the following general formulas (2) to (5).

  -[(EO)a-(PO)b]x-H    (2)

  -[(PO)b-(EO)a]x-H    (3)

  -(EO)a-[(PO)b-(EO)a]x-H    (4)

  -(PO)b-[(EO)a-(PO)b]x-H    (5)

According to the present invention, the number "a" of the oxyethylene groups in the ether group is not less than 1 and not more than 500, and the number "b" of the oxypropylene groups is not less than 1 and not more than 200.

According to the present invention, when the block polyether includes at least one selected from the ether groups represented by said general formulas (2) to (5), the mass ratio EO:PO between the oxyethylene groups and the oxypropylene groups in said ether group is not less than 10:90 and not more than 80:20.

As the ether groups satisfy the above described range, the polishing characteristics can be further improved.

In addition, according to the present invention, said basic compound may be at least one selected from a hydroxide or carbonate of an alkali metal or alkali earth metal element, a quaternary ammonium and a salt thereof, a primary amine, a secondary amine, and a tertiary amine.

Furthermore, according to the present invention, said abrasives are at least one selected from silicon dioxide, alumina, ceria, and zirconia.

Furthermore, according to the present invention, the polishing composition further including a water-soluble polymer compound can improve LPD and the surface roughness.

MODES FOR CARRYING OUT THE INVENTION

A polishing composition according to the present invention is a compound including an alkylamine structure having two nitrogen atoms represented by the following general formula (1) in which at least one block polyether is bonded to the two nitrogen atoms in the alkylamine structure, a basic compound, and abrasives. The block polyether contains a compound including an oxyethylene group and an oxypropylene group (hereinafter also abbreviated as "polishing aid"). Note that the balance is water.

  >N—R—N<    (1)

where R is an alkylene group expressed as $C_nH_{2n}$ and n is an integer which is not less than 1.

The use of the polishing composition allows the polishing speed to be increased and the surface roughness to be reduced.

Now, the polishing composition according to the present invention will be described in detail.

As for the structure, the polishing aid expressed by general formula (1) has an alkylamine structure as a basic skeleton and a block polyether, which allows the polishing characteristics to be improved.

A part of the alkylamine structure of the polishing aid adsorbs to the surface of a wafer as a work piece and said polishing aid particles adsorbed to the wafer surface are bonded to one another by the interaction between parts of the block polyether structure. Consequently, a protection layer protecting strongly the surface of the work piece is formed thereon.

When the surface of the work piece is polished while the protection layer is formed thereon, the polishing speed at the recessed part is lowered without changing the polishing speed at the raised part of the surface of the work piece and the polishing of the raised part mainly proceeds as a result, so that the surface roughness of the polished work piece can effectively be reduced.

On the other hand, the part of the polishing aid that does not adsorb to the surface of the work piece serves as a chelating agent to prevent the surface of the work piece from being contaminated for example with a metal. For example, stainless steel (SUS) is used for a member holding the work piece, and metal components such as chromium, nickel, and iron elute from the SUS member into the polishing composition to contaminate the surface of the wafer as the work piece. In the presence of the polishing aid, the metal components in the polishing composition are captured and prevented from being adsorbed to the surface of the work piece and the metal components can be removed by a liquid current of the polishing composition.

By the function of the polishing aid as described above, the metal contamination to the work piece can be prevented.

In addition, as the polishing composition, the inclusion of the basic compound can further increase the polishing speed, and a polishing composition suitable for secondary polishing can be obtained. The addition of the polishing aid can provide the polishing composition with defoaming properties.

In order to allow the polishing aid to be stably dispersed, the block polyether preferably includes at least one selected from the ether groups expressed by the following general formulas (2) to (5):

  -[(EO)a-(PO)b]x-H    (2)

  -[(PO)b-(EO)a]x-H    (3)

  -(EO)a-[(PO)b-(EO)a]x-H    (4)

  -(PO)b-[(EO)a-(PO)b]x-H    (5)

where EO represents an oxyethylene group, PO represents an oxypropylene group, and "a", "b" and "x" each represent an integer not less than 1.

In order to allow the effect resulting from the structure to be more fully provided, the block polyether particularly preferably includes at least one ether group selected from ether groups expressed by the following general formulas (6) to (9). These formulas are obtained from said general formulas (2) to (5) when x=1.

  -(EO)a-(PO)b-H    (6)

  -(PO)b-(EO)a-H    (7)

  -(EO)a-(PO)b-(EO)a-H    (8)

  -(PO)b-(EO)a-(PO)b-H    (9)

where a and b each represent an integer not less than 1.

The number "a" of oxyethylene groups included in the ether group is not less than 1 and not more than 500, preferably not less than 1 and not more than 200. The number "b" of oxypropylene groups included in the ether group is not less than 1 and not more than 200, preferably not less than 1 and not more than 50. When "a" exceeds 500 or "b" exceeds 200, the steric hindrance of the block polyether portion makes it difficult for the polishing aid to adsorb to the surface of the wafer, which could contribute to aggregation of abrasives.

Furthermore, x that represents the number of repeating units is not less than 1 and not more than 60, preferably not more than 40, more preferably not more than 20. When x exceeds 60, the polishing aid may aggregate or form emulsion to change the state of the polishing aid in the polishing composition, which degrades the polishing characteristics.

Now, the function of providing defoaming properties to the polishing composition by adding the polishing aid will be described. The polishing aid enters a film of a surfactant that forms a foamed surface and partly reduces the thickness of the film to effectively break the foam. The polishing aid is dispersed in the polishing composition and therefore can prevent foam from forming by the surfactant. The defoaming properties by the polishing aid are provided by these foam breaking effect and preventive effect.

The use of the polishing aid can reduce the foaming of the polishing composition and particularly improve surface characteristics after polishing such as LPD (light point defects), haze (surface fogginess) and COP (Crystal Originated Particle). The polishing aid satisfies the following expression (10) when the number of carbons in the alkylene group R in the alkylamine structure is "n", the number of oxyethylene groups in the block polyether is "a", the number of oxypropylene groups is "b" and the block polyether is bonded only to one nitrogen atom in the alkylamine structure, while it satisfies the following expression (11) when the block polyether is bonded to the two nitrogen atoms in the alkylamine structure.

$$1 \leq n \leq 2a+2b \quad (10)$$

$$1 \leq n \leq 2 \times (2a+2b) \quad (11)$$

When the number of the carbons in the alkylene group, the number of the oxyethylene groups, and the number of the oxypropylene groups are in the above-described range, the surface roughness can be further improved.

The mass ratio EO:PO between the oxyethylene groups and the oxypropylene groups in the block polyether is preferably not less than 10:90 and not more than 80:20.

As the block polyether satisfies the above described range, the defoaming properties, the adsorption to the wafer, and the water solubility are improved, so that the polishing characteristics can be further improved.

The content of the polishing aid in the polishing composition according to the present invention is not less than 0.00001% and not more than 10% by weight of the total amount of the polishing composition, preferably not less than 0.0001% and not more than 1% by weight, more preferably not less than 0.0005% and not more than 0.05% by weight. If the content of the polishing aid is less than 0.00001% by weight, polishing characteristics such as the defoaming properties and the surface roughness cannot be improved sufficiently. The content exceeding 10% by weight is excessive and causes particles to aggregate and sediment.

The basic compound included in the polishing composition according to the present invention is at least one selected from a hydroxide or carbonate of an alkali metal or alkali earth metal element, a quaternary ammonium and a salt thereof, a primary amine, a secondary amine, and a tertiary amine, preferably triethylenetetramine (TETA) or piperazine.

The content of the basic compound in the polishing composition according to the present invention is not less than 0.001% and not more than 10% by weight of the total amount of the polishing composition, preferably not less than 0.01% and not more than 2% by weight. If the content of the basic compound is less than 0.001% by weight, the polishing speed is lowered, while if the content exceeds 10% by weight, the proportion with the other components is out of balance, so that the polishing speed is lowered.

The kind of abrasives included in the polishing composition according to the present invention is at least one selected from silicon dioxide, alumina, ceria, and zirconia.

The content of the abrasives in the polishing composition according to the present invention is not less than 0.01% and not more than 15% by weight of the total amount of the polishing composition, preferably not less than 0.1% and not more than 10% by weight. If the content of the abrasives is less than 0.01% by weight, a sufficient polishing speed cannot be obtained, while if the content is more than 10% by weight, the abrasives are excessive and aggregate easily.

The polishing composition according to the present invention may further include a water-soluble polymer compound, and the water-soluble polymer compound is preferably a water-soluble polysaccharide such as hydroxymethyl cellulose and hydroxyethyl cellulose (HEC) or polyvinyl alcohols, preferably polyvinyl alcohol (PVA).

The content of the water-soluble polymer compound in the polishing composition according to the present invention is not less than 0.001% and not more than 10% by weight of the total amount of the polishing composition, preferably not less than 0.01% and not more than 1% by weight.

If the content of the water-soluble polymer compound is less than 0.001% by weight, the surface roughness or LPD cannot be reduced sufficiently, while if the content exceeds 10% by weight, the polishing speed is lowered.

The polishing composition according to the present invention may include a pH adjusting agent such as potassium hydroxide (KOH), calcium hydroxide, and sodium hydroxide. The pH of the polishing composition according to the present invention is adjusted using such a pH adjusting agent to be in the range of not less than 8 and not more than 12 (alkaline), preferably not less than 9 and not more than 11.

The polishing composition according to the present invention may include one or more of various additives generally used in polishing compositions in the field according to conventional techniques unless its preferable characteristics are not lost.

Water used in the polishing composition according to the present invention is not particularly limited, but pure water, ultra-pure water, ion exchanged water, and diluted water are preferably applied in view of the possibility of use in the process of manufacturing semiconductor devices.

EXAMPLES

Now, inventive examples and comparative examples will be described.

To start with, surface roughness and polishing speed were measured when the concentrations of the polishing aid, the basic compound, and the water-soluble polymer compound were varied.

The concentrations of the polishing aid and the basic compound and the measurement results are given in Table 1. Note that in the polishing composition, silicon dioxide particles were used as abrasives, TETA was used as the basic compound, and PVA was used as the water soluble polymer compound, while the polishing aid used had a structure in which two block polyether including the ether group represented by said general formula (6) are each bonded to two nitrogen atoms in an alkylamine structure (hereinafter referred to as "polishing aid 1").

In the polishing aid 1, R is an ethylene group for n=2, the number "a" of the oxyethylene groups is 16, and the number "b" of oxypropylene groups is 19. The molecular weight is 7240 and the mass ratio between the oxyethylene groups and the oxypropylene groups is EO:PO=40:60. The number of repeating units x=1.

Herein, the concentration of the polishing aid and the concentration of the basic compound refer to those of undiluted solutions, and in actual polishing process, the undiluted solutions were diluted ten-fold.

Inventive Examples 1 to 9 and Comparative Examples 1 to 3 were subjected to polishing tests in the following conditions and evaluated about polishing speed and surface roughness. Furthermore, Inventive Examples 1A and 2B and Comparative Example 1 were evaluated about LPD, while Inventive Examples 2B and 3 and Comparative Example 4 were measured about surface tension and evaluated about shaking tests.

The polishing conditions are as follows.
Polishing Conditions
Work piece wafer: 8-inch silicon wafer
Polisher: Strasbaugh single-side polisher
Polishing pad: SUBA400 (manufactured by NITTA HAAS Inc.)
Platen rotation speed: 115 rpm
Carrier rotation speed: 100 rpm
Polishing load surface pressure: 150 gf/cm$^2$
Flow rate of polishing composition: 300 ml/min
Polishing time: 6 min Polishing Speed The polishing speed is represented by the thickness of a wafer (μm/min) removed per unit time by polishing. The thickness of the wafer removed by polishing was obtained by measuring the average thickness of the wafer before and after the polishing using ADE9500 (manufactured by ADE Corporation), and the average thickness was divided by the polishing time to produce the polishing speed.

Surface Roughness

Surface roughness Ra was obtained by measuring the surface roughness of a wafer after a polishing test using non-contact surface roughness measuring instrument (New View 200/GP, manufactured by Zygo Corporation).

LPD

LPD was measured by obtaining the number of particles having a size equal to or larger than 100 nm present on the surface of a wafer after a polishing test using a wafer surface inspecting device (L56600 manufactured by Japan Electronics Engineering Co., Ltd.) and measuring the number of particles per wafer.

TABLE 1

|  | polishing aid (ppm) | basic compound (ppm) | water-soluble polymer compound (ppm) | surface roughness (Å) | polishing speed (μm/min) |
| --- | --- | --- | --- | --- | --- |
| Inv. Example 1A | 35 | 3500 | 0 | 7.1 | 0.30 |
| Inv. Example 1B | 70 | 3500 | 0 | 8.1 | 0.36 |
| Inv. Example 1C | 100 | 5000 | 0 | 7.8 | 0.32 |
| Inv. Example 1D | 150 | 7000 | 0 | 6.2 | 0.21 |
| Inv. Example 2A | 35 | 1750 | 250 | 5.2 | 0.20 |
| Inv. Example 2B | 35 | 3500 | 250 | 4.0 | 0.22 |
| Inv. Example 2C | 35 | 5000 | 250 | 3.4 | 0.23 |
| Inv. Example 2D | 35 | 10000 | 250 | 3.1 | 0.18 |
| Inv. Example 2E | 5 | 3500 | 400 | 3.3 | 0.29 |
| Comp. Example 1 | 0 | 0 | 0 | 14.5 | 0.30 |
| Comp. Example 2 | 35 | 0 | 250 | 5.5 | 0.13 |
| Comp. Example 3 | 0 | 0 | 250 | 13.1 | 0.19 |

Inventive Example 1A included 3.0% by weight of silicon dioxide particles as abrasives, 35 ppm of the above described polishing aid 1 as a polishing aid, and 3500 ppm of TETA as a basic compound and did not include a water-soluble polymer compound. Inventive Example 1B included 70 ppm of the polishing aid 1 and 3500 ppm of TETA. Inventive Example 1C included 100 ppm of the polishing aid 1 and 5000 ppm of TETA. Inventive Example 1D included 150 ppm of the polishing aid 1 and 7000 ppm of TETA. Inventive Example 2A included 3.0% by weight of silicon dioxide particles as abrasives, 35 ppm of the polishing aid 1, 1750 ppm of TETA, and 250 ppm of PVA as a water-soluble polymer compound. Only the concentration of TETA was different among Inventive Examples 2B to 2D as 3500 ppm, 5000 ppm, and 10000 ppm, respectively. Inventive Example 2E included 5 ppm of the polishing aid 1, 3500 ppm of TETA, and 400 ppm of PVA.

Comparative Example 1 did not include any of a polishing aid, a basic compound, and a water-soluble polymer compound and included colloidal silica, an organic amine, and the like. Comparative Example 2 included 35 ppm of the above-described polishing aid 1 as a polishing aid and 250 ppm of PVA as a water-soluble polymer compound. Comparative Example 3 included 250 ppm of PVA in addition to Comparative Example 1.

In Comparative Examples 1 and 3 including neither the polishing aid nor the basic compound, a high polishing speed was obtained but the surface roughness was deteriorated. When the concentration of the polishing aid was increased and the basic compound was not included, the surface roughness of a wafer was reduced or improved as in Comparative Example 2 but the polishing speed was lowered.

As in Inventive Examples 1A and 2A to 2D, when the amount of the basic compound to be added was increased while the concentration of the polishing aid was fixed, the polishing speed increased and the surface roughness was improved. In Inventive Example 2D with the addition of 10000 ppm of the basic compound, the increase in the polishing speed was reduced, but the surface roughness was further improved.

As in Inventive Examples 1A to 1D and 2E, when the concentration of the polishing aid was varied, the surface roughness was improved and the polishing speed was raised as compared to the comparative examples.

In this way, it was found that the addition of the polishing aid and the basic compound allows the surface roughness to be reduced and the polishing speed to be increased.

Then, a different kind of polishing aid was used and the surface roughness and the polishing speed were measured in the same manner as the above. The polishing aid used here was different from the polishing aid 1 used in Inventive Example 2B in that it has a different mass ratio between oxyethylene groups and oxypropylene groups and a different arrangement between EO and PO. Note that the number of repeating units is x=1 and the carbon number is n=2.

The polishing aid used in Inventive Example 3 is a polishing aid 2 that has a structure in which a block polyether including an ether group expressed by said general formula (7) is bonded instead of the block polyether including the ether group expressed by said general formula (6) of the polishing aid 1, and the mass ratio between EO and PO is EO:PO=10:90. The polishing aid used in Inventive Example 4 was a polishing aid 3 having a structure in which a block polyether including an ether group expressed by said general formula (7) is bonded instead of the block polyether group including the ether group expressed by said general formula (6) of the polishing aid 1 and the mass ratio between EO and PO is EO:PO=40:60. The polishing aid used in Inventive Example 5 is a polishing aid 4 having a structure in which a block polyether including an ether group expressed by said general formula (7) is bonded instead of the block polyether group including the ether group expressed by said general formula (6) of the polishing aid 1 and the mass ratio between EO and PO is EO:PO=80:20. The polishing aid used in Inventive Example 6 is a polishing aid 5 that has a structure in which a block polyether including an ether group expressed by said general formula (9) is bonded instead of the block polyether including the ether group expressed by said general formula (6) of the polishing aid 1, and the mass ratio between EO and PO is EO:PO=32:68. Measurement results are given in Table 2.

TABLE 2

|  | mass ratio (EO:PO) | number "a" of EO groups | number "b" of PO groups | polishing aid (ppm) | basic compound (ppm) | Ra (Å) | polishing speed (μm/min) |
|---|---|---|---|---|---|---|---|
| Comp. Example 1 | — | — | — | 0 | 0 | 14.5 | 0.30 |
| Comp. Example 2 | 40:60 | 16 | 19 | 35 | 0 | 5.5 | 0.13 |
| Inv. Example 2B | 40:60 | 16 | 19 | 35 | 3500 | 4.0 | 0.22 |
| Inv. Example 3 | 10:90 | 3 | 18 |  |  | 4.0 | 0.28 |
| Inv. Example 4 | 40:60 | 14 | 17 |  |  | 3.1 | 0.25 |
| Inv. Example 5 | 80:20 | 114 | 21 |  |  | 3.3 | 0.21 |
| Inv. Example 6 | 32:68 | 9 | 7 | 17.5 |  | 3.2 | 0.27 |

As can be seen from the results in Table 2, using different polishing aids where the mass ratio between EO and PO and the ether group structure included in the block polyether vary as expressed by said general formulas (6) to (9), the polishing speed can be increased and the surface roughness can be reduced. As compared to Comparative Examples 1 and 2 without a polishing aid or TETA, the surface roughness was reduced and the polishing speed was increased in the inventive examples.

Surface roughness and polishing speed were measured in the same manner as the above while the kind of basic compound was varied. As the basic compound, piperazine was used instead of TETA as Inventive Example 7 and potassium hydroxide (KOH) was used as Inventive Examples 8A and 8B. Measurement results are given in Table 3.

TABLE 3

|  | kind of basic compound | basic compound (ppm) | polishing aid (ppm) | Ra (Å) | polishing speed (μm/min) |
|---|---|---|---|---|---|
| Inv. Example 2B | TETA | 3500 | 35 | 4.0 | 0.22 |
| Inv. Example 7 | piperazine | 3500 | 35 | 2.8 | 0.18 |
| Inv. Example 8A | KOH | 10000 | 250 | 10.5 | 0.26 |
| Inv. Example 8B | KOH | 10000 | 500 | 8.1 | 0.19 |

It was found that using piperazine as the basic compound instead of TETA, the surface roughness and the polishing speed equivalent to those obtained using TETA can be obtained. When potassium hydroxide (KOH) was used as the basic compound instead of TETA, the degree of improvement of the surface roughness was lower than that achieved using TETA, while the polishing speed was equivalent to the speed achieved using TETA.

The kind of water soluble polymer compound was varied and the surface roughness and the polishing speed were measured in the same manner as the above. Instead of PVA, HEC was used as the water soluble polymer compound in Inventive Examples 9A and 9B. Measurement results are given in Table 4.

TABLE 4

|  | polishing aid (ppm) | basic compound (ppm) | water-soluble polymer (ppm) | surface roughness (Å) | polishing speed (μm/min) |
|---|---|---|---|---|---|
| Inv. Example 2B | 35 | 3500 | 250 (PVA) | 4.0 | 0.22 |
| Inv. Example 9A | 15 | 3500 | 100 (HEC) | 6.1 | 0.38 |
| Inv. Example 9B | 5 | 3500 | 150 (HEC) | 4.6 | 0.37 |

Using HEC as the water soluble polymer compound instead of PVA, surface roughness equivalent to that achieved using PVA was obtained and the polishing speed was further improved.

In the foregoing, how the surface roughness and the polishing speed can be improved is demonstrated. In the following, in addition to the above, evaluation of LPD will be described. The polishing compositions in Inventive Examples 1A and 2B and Comparative Example 1 were used. Results are given in Table 5.

TABLE 5

|  | LPD (>100 nm)<br>(number per wafer) |
| --- | --- |
| Inv. Example 2B | 97 |
| Inv. Example 1A | 26094 |
| Comp. Example 1 | >40000 |

It was found that in Inventive Example 2B including PVA, LPD was considerably reduced as compared to Inventive Example 1A free of PVA and the surface roughness was also reduced as shown in Table 1. In Comparative Example 1 including PVA but free of a polishing aid and a basic compound, the number exceeded 40000 as a detectable number.

Furthermore, in order to confirm the effect of defoaming properties, surface tension was measured and shaking tests were conducted. The used polishing compositions were those of Inventive Examples 2B and 3, and Comparative Example 4.

Herein, Comparative Example 4 has the same structure as those of Inventive Examples 2B and 3 except that a block polyether described in Patent Document 3 was used instead of a polishing aid. The surface tension measurement and the shaking tests were conducted as follows.

Surface Tension Test

The surface tensions of Inventive Example 2B and 3 and Comparative Example 4 were measured. The surface tension is a kind of interfacial tension and tension at a gas-liquid interface is generally referred to as "the surface tension of liquid." Using an automated contact angle meter (trade name: DM500 manufactured by Kyowa Interface Science Co., LTD.), the surface tension was measured according to the hanging drop method.

Shaking Tests

In the shaking tests, 10 ml of a polishing composition each from Inventive Examples 2B and 3 and Comparative Example 4 was placed in a 50 ml sample tube, and the sample tubes were each set at a vertical shaker (trade name: KM. Shaker V-SX manufactured by Iwaki Sangyo Co., Ltd.) and subjected to shaking for one minute at a shaking speed of 310 spm and with a shaking stroke of 40 mm. After the shaking, the sample was allowed to stand for one minute and the height of foam from the liquid surface was measured. Measurement results are given in Table 6.

TABLE 6

|  | foam height (cm) | | surface tension (mN/m) average |
| --- | --- | --- | --- |
|  | 1st | 2nd | (10 samples) |
| Inv. Example 2B | 0.8 | 0.8 | 50.8 |
| Inv. Example 3 | 0 | 0 | 42.6 |
| Comp. Example 4 | 1.6 | 1.6 | 59.3 |

Inventive Examples 2B and 3 including the polishing aid 1 had lower surface tension values and thus lower foam heights than those in Comparative Example 4 including the block polyether disclosed by Patent Document 3 instead of the polishing aid 1. As can be seen, the inclusion of the polishing aid allows defoaming properties to be obtained.

The above described results can be summarized as follows.

The inclusion of a polishing aid and a basic compound allows the polishing speed to be increased and the surface roughness to be improved.

It was found that the addition of a polishing aid allows the surface tension to be reduced as compared to the composition including the block polyether disclosed by Patent Document 3, so that high defoaming properties are obtained.

When a water-soluble polymer compound was further included, LPD was considerably reduced.

A polishing composition according to some Embodiments comprises a compound including an alkylamine structure having two nitrogen atoms represented by the following general formula (1) and at least one block polyether bonded to one of the two nitrogen atoms in the alkylamine structure, the block polyether including an oxyethylene group and an oxypropylene group;

a basic compound; and abrasives,

where R represents an alkylene group expressed by $C_nH_{2n}$ and "n" is an integer not less than 1.

In some embodiments, the polishing composition is one in which said block polyether includes at least one selected from ether groups expressed by the following general formulas (2) to (5):

where EO represents an oxyethylene group, PO represents an oxypropylene group, and "a", "b", and "x" each represent an integer not less than 1.

In some embodiments, the polishing composition is one in which the number "a" of the oxyethylene groups in said ether group is not less than 1 and not more than 500 and the number "b" of the oxypropylene groups is not less than 1 and not more than 200.

In some embodiments, the polishing composition is one in which, when said block polyether includes at least one selected from the ether groups expressed by said general formulas (2) to (5), a mass ratio EO:PO between the oxyethylene groups and the oxypropylene groups in said ether group is not less than 10:90 and not more than 80:20.

In some embodiments, the polishing composition is one in which said basic compound is at least one selected from a hydroxide or carbonate of an alkali metal or alkali earth metal element, a quaternary ammonium and a salt thereof, a primary amine, a secondary amine, and a tertiary amine.

In some embodiments, the polishing composition is one in which said abrasives are at least one selected from silicon dioxide, alumina, ceria, and zirconia.

In some embodiments, the polishing composition is one that further comprises a water-soluble polymer compound.

The present invention can be embodied in various other forms without departing from its sprit or essential features. Therefore, the above-described embodiments are simply by way of illustration in every aspect, and the scope of the invention is defined by the appended claims rather than by the description preceding them. Furthermore, all modifications and variations that fall within the scope of claims are intended to be embraced by the claims.

What is claimed is:

1. A polishing composition, comprising:
a compound including an alkylamine structure having two nitrogen atoms represented by the following general formula (1) and at least one block polyether bonded to one of the two nitrogen atoms in the alkylamine structure, the block polyether including an oxyethylene group and an oxypropylene group;
a basic compound; and
abrasives, $$>N-R-N< \quad (1)$$

where R represents an alkylene group expressed by $C_nH_{2n}$ and "n" is an integer not less than 1,
wherein said basic compound is at least one selected from a quaternary ammonium and a salt thereof, a primary amine, a secondary amine, and a tertiary amine and
a content of the compound is not less than 0.00001% and less than 10% by weight of the total amount of the polishing composition.

2. The polishing composition according to claim 1, wherein said abrasives are at least one selected from silicon dioxide, alumina, ceria, and zirconia.

3. The polishing composition according to claim 1, further comprising a water-soluble polymer compound.

4. The polishing composition according to claim 1, wherein said block polyether includes at least one selected from ether groups expressed by the following general formulas (2) to (5):

$$-[(EO)a\text{-}(PO)b]x\text{-}H \quad (2)$$

$$-[(PO)b\text{-}(EO)a]x\text{-}H \quad (3)$$

$$-(EO)a\text{-}[(PO)b\text{-}(EO)a]x\text{-}H \quad (4)$$

$$(PO)b\text{-}[(EO)a\text{-}(PO)b]x\text{-}H \quad (5)$$

where EO represents an oxyethylene group, PO represents an oxypropylene group, and "a", "b", and "x" each represents an integer not less than 1.

5. The polishing composition according to claim 4, wherein the number "a" of the oxyethylene groups in said ether group is not less than 1 and not more than 500 and the number "b" of the oxypropylene groups is not less than 1 and not more than 200.

6. The polishing composition according to claim 4, wherein when said block polyether includes at least one selected from the ether groups expressed by said general formulas (2) to (5),
a mass ratio EO:PO between the oxyethylene groups and the oxypropylene groups in said ether group is not less than 10:90 and not more than 80:20.

* * * * *